United States Patent [19]

Akasaka

[11] 4,448,632
[45] May 15, 1984

[54] METHOD OF FABRICATING SEMICONDUCTOR DEVICES

[75] Inventor: Yoichi Akasaka, Hyogo, Japan

[73] Assignee: Mitsubishi Denki Kabushiki Kaisha, Tokyo, Japan

[21] Appl. No.: 380,597

[22] Filed: May 21, 1982

[30] Foreign Application Priority Data

May 25, 1981 [JP] Japan .................................. 56-79813
May 27, 1981 [JP] Japan .................................. 56-80565

[51] Int. Cl.³ ...................... C30B 33/00; H01L 21/428
[52] U.S. Cl. .................................... 156/603; 156/612; 156/DIG. 64; 156/DIG. 73; 156/DIG. 80; 156/DIG. 102; 148/1.5; 29/576 B; 29/576 T; 427/53.1

[58] Field of Search ........................ 156/603, 612-614, 156/DIG. 102; 148/1.5, 175; 29/576 E, 576 T, 29/576 B; 427/86, 87, 95, 53.1 B; 427/86, 87, 95, 53.1

[56] References Cited

U.S. PATENT DOCUMENTS

| | | | |
|---|---|---|---|
| 3,585,088 | 6/1971 | Schwuttke et al. | 156/603 |
| 4,147,584 | 4/1979 | Garrison et al. | 156/603 |
| 4,152,182 | 5/1979 | Rutz | 156/614 |
| 4,345,967 | 8/1982 | Cook | 156/DIG. 80 |

FOREIGN PATENT DOCUMENTS

| | | | |
|---|---|---|---|
| 77169 | 7/1978 | Japan | 156/612 |
| 1043569 | 9/1966 | United Kingdom | 156/612 |

OTHER PUBLICATIONS

M. W. Geis et al., Crystallographic Orientation of Silicon on an Amorphous Substrate Using an Artificial Surface-Relief Grating and Laser Crystallization, Jul. 1, 1979, Applied Physics Lett., vol. 35, No. 1, pp. 71-74.

*Primary Examiner*—David L. Lacey
*Attorney, Agent, or Firm*—Sughrue, Mion, Zinn, Macpeak and Seas

[57] ABSTRACT

A method of manufacturing a semiconductor device utilizing a monocrystalline silicon layer includes forming and irradiating a polycrystalline silicon layer to increase the grain size thereof, and forming an epitaxial layer thereover. Both layers are then irradiated to convert them into high quality monocrystalline silicon.

16 Claims, 24 Drawing Figures

METHOD OF FABRICATING SEMICONDUCTOR DEVICES

BACKGROUND OF THE INVENTION

The present invention relates to a method of fabricating a semiconductor device by forming a monocrystalline or substantially monocrystalline semiconductor layer on an insulating or amorphous layer.

There is known a method for fabricating a semiconductor device by forming a monocrystalline or substantially monocrystalline semiconductor layer on an insulating or amorphous layer, in which, as shown in FIG. 1, a polycrystalline silicon layer 12 is formed on an insulating layer 10 of amorphous material such as $SiO_2$ by a CVD method, and the polycrystalline layer 12 is irradiated with a laser beam 20 to melt the latter to thereby increase the grain size thereof and partially convert the polycrystalline structure into a monocrystalline structure.

In another conventional method by which the crystal structure can be further improved, a grating 11 is formed on the amorphous insulating layer 10 as shown in FIG. 2a; a polycrystalline silicon layer 12 is formed on the insulating layer 10 having the grating and then the silicon layer 12 is annealed with a laser beam to form a monocrystalline silicon layer 13 as shown in FIG. 2b. In this method, the crystal orientation is regulated due to the existence of the sidewalls of the grooves of the grating, and thus it is possible to improve the crystallization.

With these conventional methods, however, the improvement in the crystallization is limited by the fact that the grain size of the polycrystalline silicon layer formed by the CVD method is increased by the annealing using one irradiation with the laser beam, and it is difficult to convert an entire polycrystalline silicon layer whose grain size is on the order of 0.1 $\mu$m into a monocrystalline silicon layer at one time. That is, in order to convert polycrystalline silicon spread over a wide area into monocrystalline silicon, it is necessary to use a laser of high power. However, the use of such a high power laser beam causes the polycrystalline silicon layer to peel off the amorphous $SiO_2$ layer, and the process margin is insufficient.

SUMMARY OF THE INVENTION

The present invention resides in the elimination of the above mentioned defects of the conventional method, and an object of the present invention is to provide a method for growing a high grade monocrystalline layer on an insulating or amorphous layer in which a polycrystalline silicon layer is disposed on the insulating or amorphous layer, and the grain size thereof is increased by annealing with a laser beam so that the crystal size of an epitaxial layer to be formed thereon later increases.

Another object of the present invention is to provide a method for growing a high grade monocrystalline island surrounded by an insulating material on an insulating or amorphous layer, in which a polycrystalline silicon layer is initially disposed on the insulating or amorphous layer and the grain size thereof is increased by annealing with a laser beam, so that the crystal size of an epitaxial layer formed thereon afterwards increases. In order to achieve this object, an oxide layer is formed over the entire area that a semiconductor device such as included in an integrated circuit, except for a portion thereof which is to become an active area, and then remaining polycrystalline silicon islands are melted by a laser beam to restrict the degree of monocrystalization so that it is practically useful.

DETAILED DESCRIPTION OF THE PREFERRED EMBODIMENTS

Figure 1:
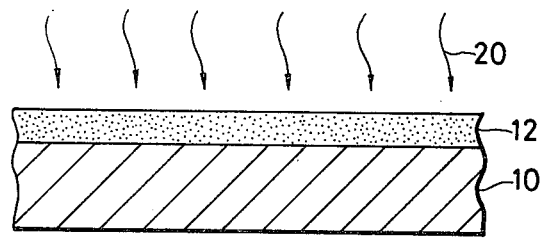
FIG. 1 illustrates a conventional method for increasing the grain size of polycrystalline silicon by the method of laser annealing.
Figure 2A:
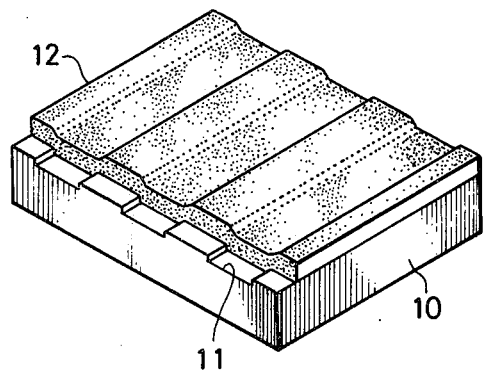
FIGS. 2a and 2b are perspective illustrations of a conventional graphoepitaxial method.
Figure 2B:
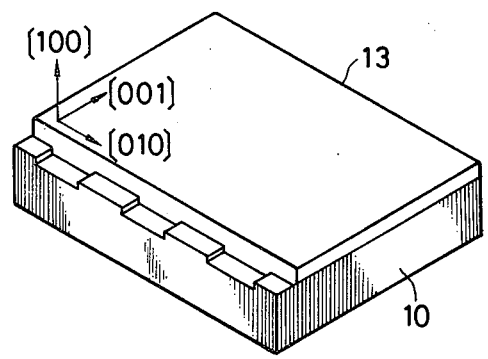
Figure 3A:
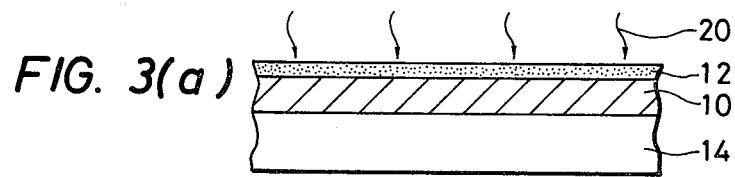
FIGS. 3a–3d are cross sectional views showing a first embodiment of the present invention.

In FIGS. 3a to 3d, which illustrate a first embodiment of the present invention, a silicon oxide ($SiO_2$) layer 10, for example, is formed by means of thermal oxidization on a semiconductor substrate 14 of a material such as monocrystalline silicon (FIG. 3a). The material of the layer 10 may be $SiO_2$, whose specific dielectricity is low, when a LSI or IC is to be incorporated in an upper portion of silicon crystal which is electrically separated from the substrate 14. When it is desired to increase the power margin of the laser annealing, the layer 10 may be of silicon nitride ($Si_3N_4$). Alternatively, it is possible to use an insulating body instead of the insulative layer on the semiconductor substrate, or amorphous material may be used for this purpose. The thickness of the $SiO_2$ layer is arbitrary. However, the thickness may be 1 to 2 $\mu$m, taking the case of the thermal oxidation formation of the $SiO_2$ and the capacitive coupling thereof to the substrate into consideration.

Figure 3B:
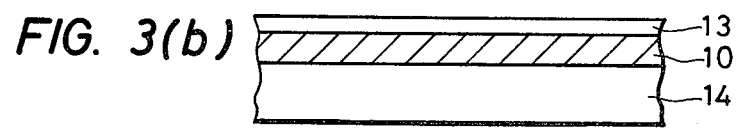

Thereafter, a thin polycrystalline silicon layer 12 is deposited using the CVD method. The thickness of the layer 12 may be on the order of 0.1 to 0.3 $\mu$m. The layer 12 is then irradiated with a laser beam 20 to increase the grain size thereof. The laser power to be used should be enough to melt the polycrystalline silicon layer 12 and increase the grain size thereof, as shown in FIG. 3b, to thereby obtain a polycrystalline silicon layer 13 containing monocrystals having a size ranging from 5 $\mu$m to several tens of $\mu$m. The laser to be used may be of the continuous wave (CW) type, such as a CW Argon laser.

Figure 3C:
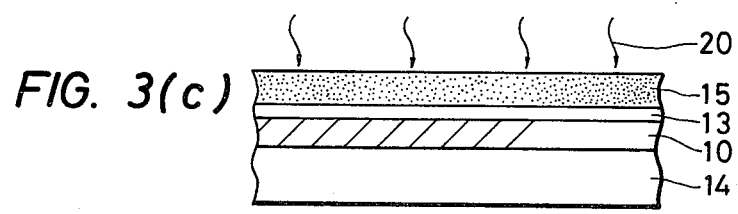

Then, as shown in FIG. 3c, an epitaxial layer 15 containing mainly silicon is formed on the layer 13.

Figure 3D:
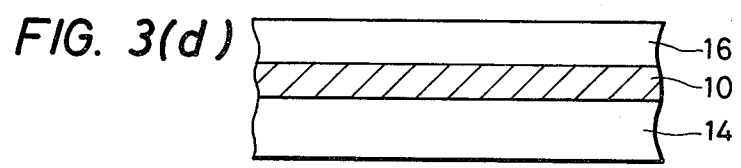

It should be noted that the conditions of the epitaxial growth of the layer 15 severely affect the properties of the layer to be obtained later. The conditions under which the most preferable crystal is obtained are those where epitaxial growth is performed under a reduced pressure in an atmosphere constituted mainly of dichlorosilane ($SiH_2Cl_2$) gas at a relatively high temperature (e.g. 1080° C.). The thickness may be determined according to the device structure to be made and the energy of the laser light etc. and usually is on the order to 0.5 to 1.0 $\mu$m. When the layer is too thin, the control of epitaxial growth becomes insufficient. The polycrystalline silicon layers 13 and 15 are then melted by laser light from a CW laser similar to the laser light 20 in FIG. 3a, to convert them into monocrystalline silicon, to thereby obtain a monocrystalline silicon layer 16 as shown in FIG. 3d. The layers 13, 15 and 16 will be laterally delineated in a process to be described latter to form corresponding islands 13, 15 and 16.

By preliminarily forming the thin polycrystalline silicon layer 12 and enhancing the monocrystalization of the layer 12 by laser annealing, the crystal size of the epitaxial layer 15 formed on the layer 12 becomes very large. Therefore, with the next laser annealing, it is possible to obtain a high quality monocrystal spread over a very wide area.

Figure 4A:
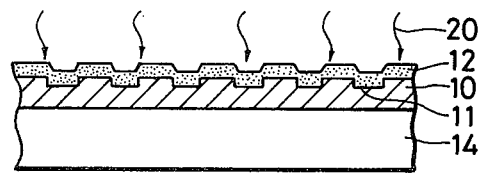
FIGS. 4a–4d are similar views showing a second embodiment of the present invention.
Figure 4B:
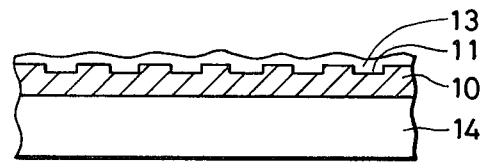
Figure 4C:
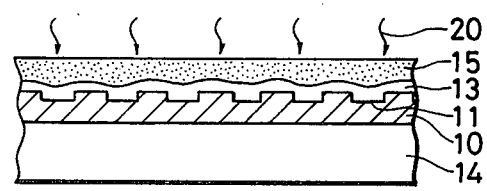
Figure 4D:
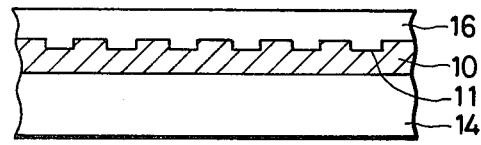

A second embodiment of the present invention is shown in FIGS. 4a to 4d, in which a graphoepitaxial method is combined with the first embodiment to further improve the crystallization. In FIG. 4a, a thin polycrystalline silicon layer 12 is deposited on a grating 11 of the $SiO_2$ layer 10 and then annealed with laser light. Then, the process similar to that shown in FIG. 3 is performed to obtain a high quality crystalline layer 16.

Figure 5A:
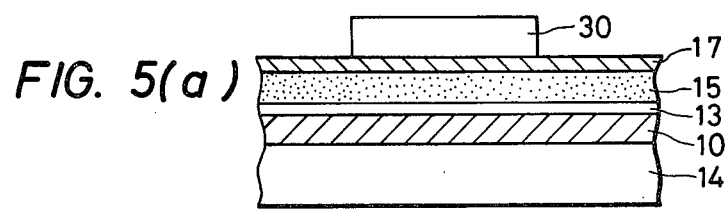
FIGS. 5a–5e are similar views showing a third embodiment of the present invention.
Figure 5B:
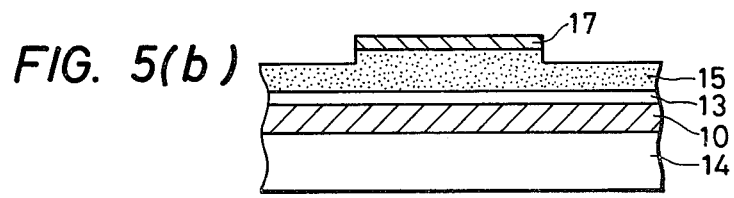
Figure 5C:
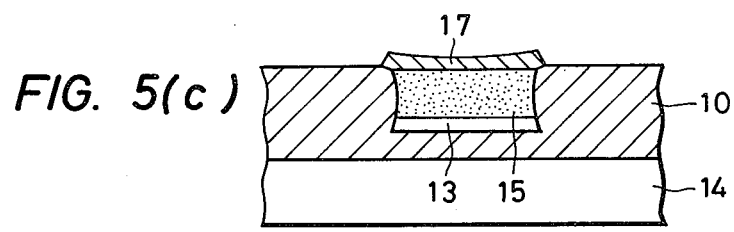

FIGS. 5a to 5e illustrate a third embodiment of the present invention. As shown in FIG. 5a, on the epitaxial layer 15, which is the uppermost layer of the lamination of the monocrystalline silicon substrate 14, the silicon oxide or silicon nitride layer 10, the polycrystalline silicon layer 13 containing monocrystalline silicon and the epitaxial layer 15 which was prepared according to the steps shown in FIGS. 3a to 3c, an antioxidization layer 17 of silicon nitride ($Si_3N_4$) is formed. At this time it is possible to provide a $SiO_2$ layer (not shown) beneath the $Si_3N_4$ layer 17. Such layer may be used as a pad. The thickness of the $Si_3N_4$ layer 17 may be on the order of 500–10000 Å, and that of the $SiO_2$ layer beneath the layer 17, if any, may be on the same order. Then as shown in FIG. 5a a photoresist 30 is formed on each portion corresponding to separation areas of the semiconductor device to be produced, and a conventional photo-engraving technique is used to etch away the $Si_3N_4$ layer 17 and the polycrystalline silicon layer 15 below the layer 17 which are not under the photoresist 30. After etching, the photoresist 30 on the layer 17 is removed as shown in FIG. 5b. Then, by using the exposed layer 17 as a mask, oxidization is performed to oxidize the remaining portions of the silicon layers 13, 15, so that the region of the silicon layer 15 under the mask, i.e., a silicon island, is surrounded by an oxide layer 10 as shown in FIG. 5c. The above process is known as the so-called isoplanar method.

Figure 5D:
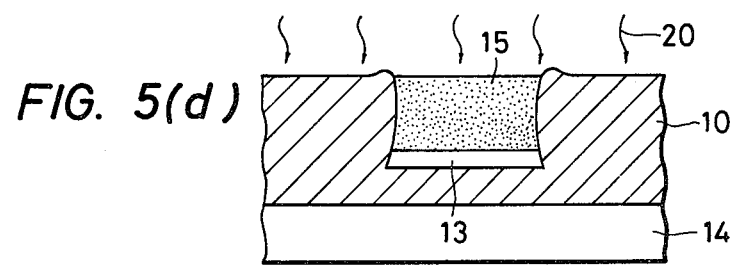
Figure 5E:
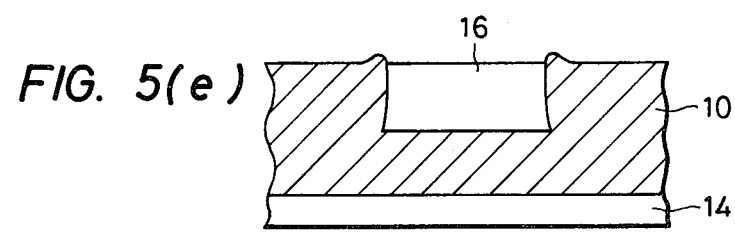

Thereafter, the remaining $Si_3N_4$ layer 17 is removed and the silicon island 13, 15 is laser-annealed as shown in FIG. 5d, to convert it into a monocrystalline silicon island 16 as shown in FIG. 5e. The region to be melted may be only that region of the silicon island which is to become an active region, and the area thereof is usually on the order of 5×20 μm when a LSI is to be formed. It has been found that the monocrystalization of a region having a size as above is easily achieved by this embodiment. It is also possible to use the $Si_3N_4$ layer as an anti-reflection layer and to laser-anneal the silicon layer in the state shown in FIG. 5c.

In the third embodiment, since the silicon layer 15 surrounded by the thick $SiO_2$ layer 10 is melted, and since the layer 10 has good thermal conductivity and acts as a heat radiator, it is possible to use a laser of less power, simplifying the process, and making it easy to perform.

Figure 6A:
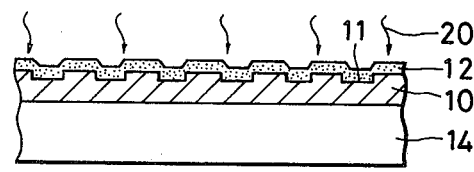
FIGS. 6a–6h are similar views showing a fourth embodiment of the present invention.
Figure 6B:
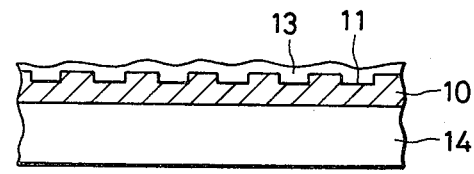
Figure 6C:
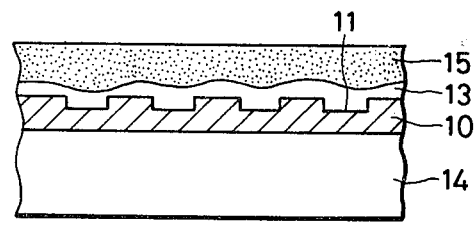
Figure 6D:
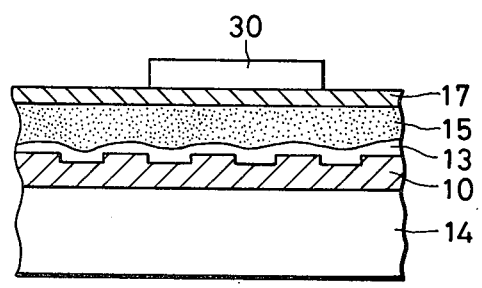
Figure 6E:
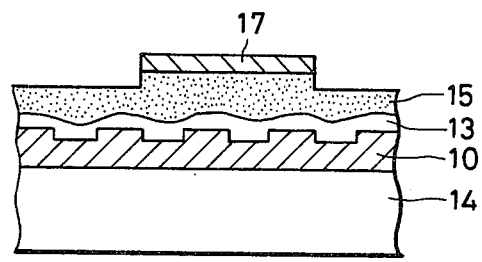
Figure 6F:
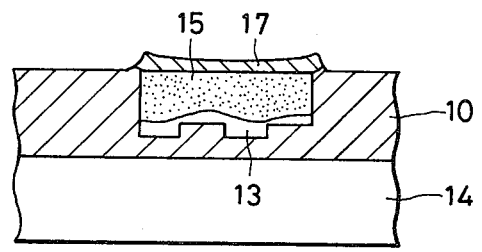
Figure 6G:
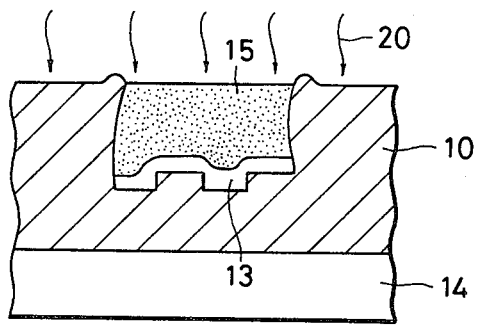
Figure 6H:
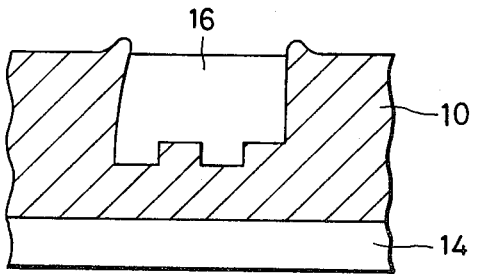

FIGS. 6a to 6b illustrate a fourth embodiment of the present invention, in which crystallization is further improved as compared with the third embodiment by combining the same with the graphoepitaxial method. In FIG. 6a, a polycrystalline silicon layer 12 is deposited on the gratings 11 of the $SiO_2$ 10 and is laser-annealed. Subsequent to a process similar to that employed in the third embodiment of FIG. 5, a monocrystalline silicon island 16 having good crystallinity is obtained.

As mentioned hereinbefore, the features of the present invention reside in the annealing of the initial thin polycrystalline silicon layer previously to the provision of the epitaxial layer on the annealed layer. Although it is impossible to achieve the intention of the present invention by using a CVD polycrystalline silicon layer instead of the epitaxial layer, a satisfactory polycrystalline silicon having sufficiently large grain size can be obtained by epitaxial growth under a reduced pressure at a relatively high temperature. Large monocrystals are obtained by annealing the polycrystalline silicon thus obtained with a laser or electron beam.

Further, by surrounding the polycrystalline silicon layer whose grain size is increased, and laser-annealing the surrounded layer, the polycrystalline silicon is melted and recrystallizes, and thus it is easily converted into monocrystalline silicon. It is easy to form elements such as MOS transistors and/or bipolar transistors within the Si land thus obtained, using known techniques. Therefore, it becomes possible to manufacture high performance semiconductor elements of very small size.

Although the present invention requires the formation of a pair of stacked polycrystalline silicon layers and two laser or electron beam annealings, the monocrystalline silicon obtained is large in size and is of a high quality superior to those obtainable by the conventional SOS (Silicon-on-Sapphire) or SOI (Silicon-on-Insulator) methods.

What is claimed is:

1. A method of fabricating semiconductor devices, comprising the steps of forming a polycrystalline silicon layer on an insulating or amorphous layer; irradiating said polycrystalline silicon layer with a laser or electron beam so as to increase the grain size of said polycrystalline silicon layer and to provide a plurality of monocrystals in the polycrystalline layer; epitaxially forming a layer primarily containing silicon on said altered polycrystalline silicon layer; and melting said epitaxially grown layer and said polycrystalline silicon layer with an irradiation of a laser or electron beam so as to obtain a monocrystalline layer from said epitaxially grown layer and said polycrystalline silicon layer.

2. A method as claimed in claim 1, including forming a grating on the upper surface of said insulating or amorphous layer on which said polycrystalline silicon layer is formed.

3. A method as claimed in claims 1, or 2, wherein said insulating layer is of silicon oxide.

4. A method as claimed in claim 3, wherein the thickness of said silicon oxide layer is in a range from 1 to 2 μm.

5. A method as claimed in claims 1 or 2, wherein said insulating layer is of silicon nitride.

6. A method as claimed in claim 1, wherein the thickness of said polycrystalline silicon layer is in a range from 0.1 to 0.3 μm.

7. A method as claimed in claim 1, wherein said epitaxially grown layer is formed in a $SiH_2Cl_2$ atmosphere under a reduced pressure.

8. A method as claimed in claim 1, wherein the thickness of said epitaxially grown layer is in a range from 0.5 to 1.0 μm.

9. A method of fabricating a semiconductor device, comprising the steps of forming a polycrystalline silicon layer on an insulating or amorphous layer; irradiating said polycrystalline silicon layer with a laser or electron beam so as to increase the grain size of said polycrystalline silicon layer and to provide a plurality of monocrystal in the polycrystalline layer; epitaxially forming a layer primarily containing silicon on said altered polycrystalline silicon layer; partially oxidizing said epitaxially grown layer to form an oxide layer spreading through said polycrystalline silicon layer to said insulating or amorphous layer to thereby electrically separate a non-oxidized portion of said epitaxially grown layer from the remaining portions thereof; and melting said non-oxidized portion of said epitaxially grown layer and said polycrystalline silicon layer beneath said non-oxidized portion with a laser or electron beam to monocrystalline said epitaxially grown and polycrystalline silicon layers.

10. A method as claimed in claim 9, including forming a grating on the upper surface of said insulating or amorphous layer on which said polycrystalline silicon layer is formed.

11. A method as claimed in claims 9 or 10, wherein said insulating layer is of silicon oxide.

12. A method as claimed in claim 11, wherein the thickness of said silicon oxide layer is in a range from 1 to 2 μm.

13. A method as claimed in claims 9 or 10, wherein said insulating layer is of silicon nitride.

14. A method as claimed in claim 9, wherein the thickness of said polycrystalline silicon layer is in a range from 0.1 to 0.3 μm.

15. A method as claimed in claim 9, wherein said epitaxially grown layer is formed in a $SiH_2Cl_2$ atmosphere under a reduced pressure.

16. A method as claimed in claims 9 or 15, wherein the thickness of said epitaxially grown layer is in a range from 0.5 to 1.0 μm.

* * * * *